(12) United States Patent
Torres et al.

(10) Patent No.: US 7,989,342 B2
(45) Date of Patent: Aug. 2, 2011

(54) FORMATION OF A RELIABLE DIFFUSION-BARRIER CAP ON A CU-CONTAINING INTERCONNECT ELEMENT HAVING GRAINS WITH DIFFERENT CRYSTAL ORIENTATIONS

(76) Inventors: Joaquin Torres, Saint Martin le Vinoux (FR); Laurent Gosset, Grenoble (FR); Sonarith Chhun, La Trinite (FR); Vincent Arnal, Grenoble (FR)

( * ) Notice: Subject to any disclaimer, the term of this patent is extended or adjusted under 35 U.S.C. 154(b) by 140 days.

(21) Appl. No.: 12/529,647

(22) PCT Filed: Mar. 3, 2008

(86) PCT No.: PCT/EP2008/052565
§ 371 (c)(1),
(2), (4) Date: Sep. 2, 2009

(87) PCT Pub. No.: WO2008/107419
PCT Pub. Date: Sep. 12, 2008

(65) Prior Publication Data
US 2010/0120243 A1    May 13, 2010

(51) Int. Cl.
*H01L 21/4763* (2006.01)
(52) U.S. Cl. ........ 438/643; 438/618; 438/622; 438/635; 438/641; 438/644; 438/653; 438/654; 438/655; 438/687
(58) Field of Classification Search .................. 438/618, 438/622, 635, 641, 643, 644, 653–655, 687
See application file for complete search history.

(56) References Cited

U.S. PATENT DOCUMENTS

| | | | |
|---|---|---|---|
| 5,447,887 A | 9/1995 | Filipiak et al. | |
| 6,339,025 B1 | 1/2002 | Liu et al. | |
| 6,599,827 B1 * | 7/2003 | Ngo et al. | 438/627 |
| 6,660,634 B1 | 12/2003 | Ngo et al. | |
| 7,309,651 B2 * | 12/2007 | West et al. | 438/687 |
| 2002/0155702 A1 | 10/2002 | Aoki et al. | |
| 2005/0161817 A1 * | 7/2005 | Meyer et al. | 257/751 |

(Continued)

OTHER PUBLICATIONS

S. Chhun, L.G. Gosset, J. Michelon, V. Girault, J. Vitiello, M. Hopstaken, S. Courtas, C. Debauche, P.H.L. Bancken, N. Gaillard, G. Bryce, M. Juhel, L Pinzelli, J. Guillan, R. Gras, B. Van Schravendijk, J.-C. Dupuy, J. Torres; Cu surface treatment influence on Si adsorption properties of CuSiN self-aligned barriers for sub-65 nm technology node; ScienceDirect; Microelectronic Engineering 83; 2006; 2094-2100.
International Search Report; PCT/EP2008/052565; Jun. 26, 2008.
Written Opinion of the International Searching Authority; PCT/EP2008/052565; Jun. 26, 2008.

*Primary Examiner* — Kevin M Picardat
*Assistant Examiner* — Bac H Au

(57) ABSTRACT

The present invention relates to a method for fabricating a diffusion-barrier cap on a Cu-containing interconnect element that has crystallites of at least two different crystal orientations, comprises selectively incorporating Si into only a first set of crystallites with at least one first crystal orientation, employing first process conditions, and subsequently selectively forming a first adhesion-layer portion comprising CuSi and a first diffusion-barrier-layer portion only on the first set of crystallites, thus forming a first barrier-cap portion, and subsequently selectively incorporating Si into only the second set of crystallites, employing second process conditions that differ from the first process conditions, and forming a second barrier-cap portion comprising a Si-containing second diffusion-barrier layer portion on the second set of crystallites of the interconnect element. The processing improves the properties of the diffusion-barrier cap and secures a continuous formation of a diffusion-barrier layer on the interconnect element.

8 Claims, 2 Drawing Sheets

U.S. PATENT DOCUMENTS

2006/0281299 A1* 12/2006 Chen et al. .................... 438/622
2007/0018332 A1   1/2007 Ueno
2007/0035029 A1   2/2007 Caubet et al.
2008/0311739 A1* 12/2008 Besling et al. ................ 438/643

* cited by examiner

FORMATION OF A RELIABLE DIFFUSION-BARRIER CAP ON A CU-CONTAINING INTERCONNECT ELEMENT HAVING GRAINS WITH DIFFERENT CRYSTAL ORIENTATIONS

FIELD OF THE INVENTION

The present invention relates to a method for fabricating a diffusion-barrier cap on a Cu-containing interconnect element that has crystallites of at least two different crystal orientations in an interconnect stack of a semiconductor device.

BACKGROUND OF THE INVENTION

The semiconductor industry has achieved a steady increase of the integration density of semiconductor devices with integrated circuits. Also a rapid increase of the frequencies, at which circuit elements may be operated, has been achieved. Both developments have been enabled, among others, by the replacement of aluminum and aluminum alloys as conductive materials for interconnect elements by copper. Copper has a lower electric resistance than aluminum and aluminum alloys and is more resistant to electromigration than these materials.

The interconnect elements are typically arranged in a stacked layer architecture referred to as interconnect stack and form conductive lines, plugs, or vias of an interconnect network, according to the specific requirements of a particular integrated circuit. The interconnect elements of an interconnect stack are typically separated from each other by layers of a dielectric material.

The introduction of copper (Cu) in the fabrication of interconnect elements for integrated circuits requires barriers to prevent a diffusion of Cu from the interconnect element into a respective adjacent dielectric layer or into the semiconductor substrate. A diffusion of Cu would give rise to a rapid degradation of interconnect structures. This in turn affects the performance of active devices of an integrated circuit or leads to an early.

U.S. Pat. No. 6,339,025 B1 describes the fabrication of a capping layer as a diffusion barrier on a Cu interconnect element. In the described process flow, a copper interconnect element is provided that is laterally defined by lateral barrier layers preventing the diffusion of copper into a laterally surrounding dielectric layer. The structure is subjected to chemical mechanical polishing (CMP) to remove residual copper and barrier-layer material from the dielectric layer. On the exposed dielectric layer and the exposed interconnect elements, a silicon-rich silicon nitride layer is formed by plasma-enhanced chemical vapor deposition. In this step, silane and ammonium $NH_3$ are used as precursors. A sufficiently high ratio of the flow rates of silane and ammonium leads to a high silicon content in the silicon nitride layer. This favors a reaction of the deposited silicon with copper and results in a copper silicide layer, which is formed between the exposed copper interconnect element and the silicon nitride layer. The copper silicide layer enhances the adhesion of the silicon-rich nitride layer, which forms the capping layer.

It has been observed that the SiN capping layer on top of the CuSi-layer built with such processing is often discontinuous in Cu-based interconnect elements with grains of different crystal orientations, resulting in a locally defective diffusion-barrier cap. This causes reliability problems such as undesired shortcuts in the interconnect stack and Cu-related deep defects in silicon, which lead to a corrupted device performance and a reduced device lifetime.

SUMMARY OF THE INVENTION

It is desirable to provide an improved diffusion-barrier cap for preventing diffusion of copper from a Cu-containing interconnect element.

According to a first aspect of the invention, a method for fabricating a diffusion-barrier cap on a Cu-containing interconnect element that has crystallites of at least two different crystal orientations in an interconnect stack of a semiconductor device is provided. The method comprises:

selectively incorporating Si into only a first set of crystallites with at least one first crystal orientation, employing first process conditions, and subsequently selectively forming a first adhesion-layer portion comprising CuSi and a first diffusion-barrier-layer portion only on the first set of crystallites, thus forming a first barrier-cap portion and leaving a second set of crystallites of the interconnect element with at least one second crystal orientation exposed, or, in other words, uncovered, and subsequently selectively incorporating Si into only the second set of crystallites, employing second process conditions that differ from the first process conditions, and forming a second barrier-cap portion comprising a Si-containing second diffusion-barrier layer portion on the second set of crystallites of the interconnect element.

The method of the invention overcomes the reliability problems caused by a discontinuous diffusion-barrier cap and enables the fabrication of reliable devices with a long lifetime.

The method is based on the recognition that, under certain process conditions, an incorporation rate of silicon into a Cu-containing interconnect element depends on the crystal orientation of crystallites forming the surface of the interconnect element that is to be covered by the diffusion-barrier cap. A crystallite is a domain of solid-state matter that has the same structure as a single crystal. Crystallites are also referred to as grains. The first and second sets of crystallites are distinguished by crystal orientations, which give rise to an exposure of respective different lattice planes at the surface of the interconnect element. The respective crystal orientation of the respective first and second sets of crystallites influences their respective ability to incorporate silicon under certain process conditions.

The term process conditions refers to the values of physical parameters characterizing an ambient atmosphere, typically a fluid, in particular a gaseous atmosphere, to which the interconnect element is exposed during respective process steps, a duration of particular steps of the processing, or the like. Crystallites with some specific first crystal orientations exhibit a high probability of Si incorporation under certain process conditions, which process conditions are also referred to as the first process conditions. These crystallites are referred to as the first set of crystallites. In contrast, under the first process conditions, other crystallites with some specific second crystal orientations exhibit an only small to vanishing probability for incorporation of Si atoms for the purpose of the adhesion-layer or diffusion-barrier-layer formation.

In turn, this effect influences the formation rate of an adhesion layer containing CuSi on the different crystallites of different crystal orientation, and of a Si-containing diffusion-barrier layer portion on different crystallites of different crystal orientation.

The method of the invention makes use of this effect to improve the control over the formation of a continuous diffusion-barrier cap. The method separates the formation of a continuous diffusion-barrier cap on the whole surface of the interconnect element into two separate phases. The first process conditions are employed to achieve a selective adhesion-layer formation only on the first set of crystallites of the interconnect element that have the first crystal orientation. There may be more than one crystal orientation that allows a selective Si incorporation under the first process conditions. However, due to the described selectivity of the Si incorporation, the first process conditions result in the formation of openings in the adhesion layer over the second set of crystallites of the interconnect element with at least one second crystal orientation. Therefore, when considering the whole surface to be covered by the diffusion-barrier cap, the Si incorporation into the crystallites of the interconnect elements, in particular into Cu crystallites, is deliberately kept discontinuous, and so is the formation of a diffusion barrier-cap after the Si incorporation.

The formation of a second barrier-cap portion on the second set of crystallites is according to the invention performed in a subsequent processing phase that employs second process conditions differing from the first process conditions.

The method of the invention thus turns away from the known concept of Si incorporation into the whole surface of the interconnect element in one single incorporation step. By individually performing the respective Si incorporation and the respective subsequent formation of the diffusion-barrier cap in two separate processing phases according to different crystal orientations, the method of the invention achieves the advantage that a control of the incorporation of silicon into the first and second sets of crystallites can be improved.

In particular, the Si incorporation into the first, highly reactive set of crystallites can be controlled better. No care has to be taken in the first phase of the processing to also incorporate silicon into the second set of crystallites. As a consequence, the Si corporation into the first set of crystallites can be controlled very precisely. More specifically, the Si incorporation into the first set of crystallites can be limited to an amount that is really required. An increased incorporation of Si into the first set of crystallites of the interconnect element would lead to an increased electrical resistance, which is detrimental for many applications, including those requiring high-frequency operation. A higher resistance of the interconnect elements also increases the production of heat during operation, which causes problems in particular at high integration densities.

The first barrier-cap portion on the first set of crystallites serves as a mask during the second processing phase, in which the second barrier-cap portion is fabricated on the second set of crystallites. This allows a selective incorporation of silicon into only the second set of crystallites of the interconnect element in this second processing phase under second process conditions that differ from the first process conditions. Due to the presence of the first-barrier cap portion during the second process phase, the second process conditions can be set suitably to achieve a desired Si incorporation into the second set of crystallites without taking a risk of incorporating an undesired high amount Si into the first set of crystallites at the same time. In turn, the control of Si incorporation into the second set of crystallites is also improved.

The method of the invention therefore not only achieves the formation of a continuous diffusion-barrier cap on a Cu-containing interconnect element, but also avoids an incorporation of undesired, i.e., too large or too small amounts of Si into the different crystallites at the surface of interconnect element.

A "Cu-containing interconnect element" for the purpose of the present application is an interconnect element that comprises at least a surface layer, which is made of Cu crystallites or crystallites of a Cu alloy. Note in this context that the first set of crystallites may contain crystallites with one or more different crystal orientations. Similarly, the second set of crystallites may contain crystallites with one or more different crystal orientations. Another component of the Cu alloy can for instance be Mg, Se, Zr, Hf, Nb, Ta, Cr, or Mo, or a combination of two or more of these elements. In one embodiment, the interconnect element consists of copper, except for some silicon that may be present in the interconnect element after the processing of the invention. Of course, silicon will also be present when using a Cu alloy.

The processing of the method of the invention can be further differentiated to distinguish between separate subsequent processing phases with respective different process conditions for three or more sets of crystallites.

In the following, embodiments of the method of the invention will be described. Unless described otherwise explicitly, the embodiments can be combined with each other.

In one embodiment, forming the first barrier-cap portion comprises exposing a surface of the Cu-containing interconnect element containing the first and second sets of crystallites to a first ambient atmosphere that contains a silicon precursor and that has a first ambient pressure and a first ambient temperature, which is lower than a threshold temperature required for incorporation of Si into the second set of crystallites at the first ambient pressure. The first ambient temperature is suitably between 200 degrees Celsius and 425 degrees Celsius. In one embodiment, the first ambient temperature is 325 degrees Celsius. A silicon precursor is a silicon-containing compound, which is used as a source of silicon in the deposition process. Suitable silicon precursors are for instance silane, dichlorsilane, and trimethylsilane. In different alternative embodiments, the silicon incorporation employs a thermal or a plasma-enhanced process. The use of a plasma is believed to improve the efficiency of the silicon precursor and thus allows reducing the silicon-precursor flow without reducing the incorporation of silicon into the crystallites.

In one embodiment, the step of forming the first barrier-cap portion comprises forming, on the first set of crystallites of the interconnect element, a first temporary layer stack comprising a first temporary layer, which contains Cu and Si chemically unbonded to each other, and a second temporary layer comprising copper silicide on the first temporary layer, and providing nitrogen to the first temporary layer stack in a first reactive annealing step, thus transforming the first temporary layer stack into the first barrier-cap portion that contains, on the first set of crystallites, a copper silicide (CuSi) layer, and a Si-containing and N-containing diffusion-barrier layer on the copper silicide layer.

The use of a first barrier-cap portion that contains a copper silicide layer between the Si-containing diffusion-barrier layer and the first set of crystallites has the advantage of increasing the adhesion of the barrier material, which in one embodiment is silicon nitride. Other barrier materials can be used in combination with a CuSi layer. Suitable materials that prevent a diffusion of Cu and can be used in the context of the present invention are, beside silicon nitride, for instance silicon oxynitride, silicon carbide, hydrogenated oxidized silicon carbon (SiCOH), or CuSiN. Other diffusion-barrier materials can be employed in the structure and fabricated utilizing suitable precursors known in the art.

A CuSi phase completion on the respective first or second set of crystallites can be achieved by different methods. In alternative embodiments, a nitrogen-providing ambient atmosphere contains either molecular nitrogen $N_2$ or $NH_3$ or both. In some embodiments, the annealing step is performed at an annealing temperature of 300 degrees Celsius or more than 300 degrees Celsius.

In one of two alternative processing embodiments, forming the second barrier-cap portion comprises:

forming, on the second set of crystallites of the interconnect element in the openings of the first layer stack, a second temporary layer stack with a layer sequence equal to that of the first temporary layer stack, and providing nitrogen to the second temporary layer stack in a second reactive annealing step, thus transforming the second temporary layer stack into the second barrier-cap portion that contains a copper silicide layer on the second set of crystallites of the interconnect element and a silicon nitride layer on the copper silicide layer.

The formation of the second barrier-cap portion in the present embodiment resembles the formation of the first barrier-cap portion. It results in a diffusion-barrier layer on top of a CuSi layer in both the first and the second barrier-cap portions.

Preferably, the step of forming the second temporary layer stack comprises exposing the surface containing the first barrier-cap portion and the second set of crystallites of the Cu-containing interconnect element to a second ambient atmosphere that has a second ambient pressure and that contains a silicon precursor, at a second ambient temperature higher than a threshold temperature for incorporation of Si into the second set of crystallites at the second ambient pressure and higher than the first ambient temperature. The second ambient pressure is in one embodiment the same as the first ambient pressure.

The use of a second ambient temperature that is higher than the first ambient temperature and higher than a threshold temperature for incorporation of Si into the second set of crystallites at the second ambient pressure in this embodiment enables the selective incorporation of Si into the second set of crystallites and the subsequent completion of the CuSi layer on the whole surface of the interconnect element. In this embodiment, therefore, the adhesion of the diffusion-barrier layer on top of the CuSi layer is particularly high due to the presence of a continuous CuSi layer.

In an alternative processing embodiment for the formation of the second barrier-cap portion, the following steps are performed:

forming, on the second set of crystallites of the interconnect element in the openings of the first layer stack, only a third temporary layer, which contains Cu and Si chemically unbonded to each other;

providing nitrogen to the third temporary layer in a second reactive annealing step, thus transforming the third temporary layer into a second barrier-cap portion that contains only a silicon nitride layer.

This processing leads to a formation of the diffusion-barrier layer in between the discontinuous CuSi film on the first set of crystallites, which was fabricated during the previous first processing phase. This embodiments achieves a completion of the diffusion-barrier layer even though no CuSi layer is provided. However, the barrier properties are improved in comparison with a processing that leaves the second set of crystallites uncovered.

In some embodiments that use the second alternative processing, forming the second temporary layer comprises exposing the second set of crystallites to a second ambient atmosphere that contains the silicon precursor under the following process conditions:

a second temperature smaller than or equal to the first temperature, and a second ambient pressure that is higher than the first ambient pressure or a second exposure duration that is longer than the first exposure duration.

This processing leads to a limited Si incorporation into the second set of crystallites and avoids the formation of chemical bonds between the Cu of the second set of crystallites and the incorporated Si.

Further preferred embodiments of the invention are defined in the dependent claims.

BRIEF DESCRIPTION OF THE DRAWINGS

These and other aspects of the invention will be apparent from and elucidated with reference to the embodiment(s) described hereinafter. In the following drawings.

DETAILED DESCRIPTION OF EMBODIMENTS

FIGS. 1 to 5 show a schematic cross-sectional view of a section of an interconnect element during different phases of a fabrication of a diffusion-barrier cap on the interconnect element, according to a first embodiment.

Figure 1:
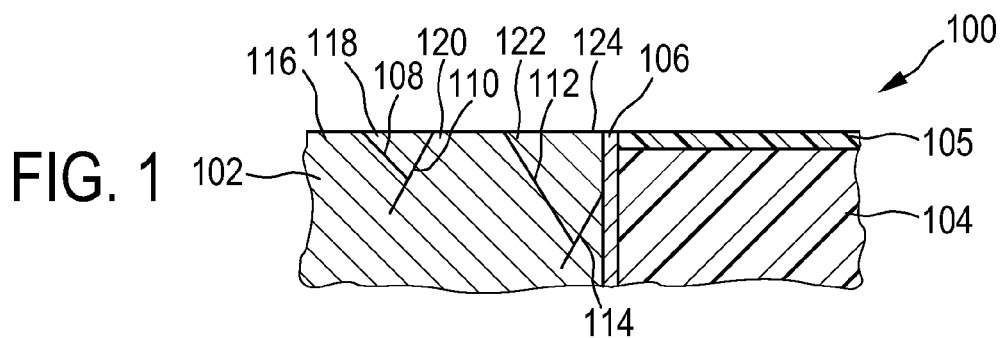
FIGS. 1 to 5 show a schematic cross-sectional view of a section of an interconnect element during different phases of a fabrication of a diffusion-barrier cap on the interconnect element, according to a first embodiment.

FIG. 1 shows a section of an interconnect stack 100 during its fabrication. At the processing stage displayed in FIG. 1, a Cu-containing interconnect element 102 has been embedded into a dielectric layer 104. The dielectric layer 104 is covered by a dielectric liner 105. The dielectric liner was introduced on top of 104 the dielectric layer 104 prior to a patterning of the features by lithography and etching, and prior to the formation of a diffusion barrier 106 and Cu filling. However, this is an option. The dielectric liner 105 is not necessarily required for the processing of the present embodiment. In one embodiment, the dielectric liner is not deposited at all. In another embodiment, it is completely removed from the wafer surface during a Mechanical polishing step preceding the processing stage shown in FIG. 1.

A lateral section of a diffusion barrier 106 is arranged between the interconnect element 102 and the dielectric layer 104. The diffusion barrier 106 is in one embodiment made of a TaN/Ta structure.

Note that the present Figure and the following Figures only show a section of the interconnect stack 100 at serves to illustrate the processing of the present embodiment. For simplicity, the Figures do not show a complete interconnect element, nor a complete interconnect stack. It is to be understood that the interconnect element 102 is completely embedded into the dielectric layer 104. The interconnect element is further separated from the dielectric layer 104 by the diffusion barrier 106. The processing of the present embodiment is suitable for integration into a single or dual damascene process for the formation of an interconnect stack.

The Cu-containing interconnect element 102 is in the present embodiment made of Cu. It contains crystallites or grains, which in FIG. 1 are illustrated by grain boundaries. The grain boundaries 108 to 114 separate different crystallites 116 to 122 on the phase 124 of the interconnect element 102. The graphical representation of the crystallites 116 to 122 is only schematic. The Cu crystallites in the interconnect element 102 typically have different crystal orientations. That means, lattice planes of the different crystallites 116 to 122 that form the surface 124 have two or more different Miller indices.

Si incorporation into the different crystallites with different crystal orientation occurs at different rates for given process conditions. In the present embodiment, two different sets of crystallites are illustrated. The crystallites 116 and 120 form a first set of crystallites with a first crystal orientation. The crystallites 118 and 122 form a second set of crystallites with a second crystal orientation. For the purpose of the present description, it is assumed that the incorporation rate of silicon into the first set of crystallites is higher than incorporation rate of silicon into the second set of crystallites at first process conditions. The process conditions are characterized by a temperature $T_0$ of an ambient atmosphere containing a Si precursor, a pressure $P_0$ of the ambient atmosphere, and a duration $t_0$ of providing the ambient atmosphere containing the Si precursor. A suitable Si precursor is silane. Other suitable Si precursors are trimethylsilane and dichlorsilane. The process conditions are in one embodiment further characterized by RF power employed in a plasma-enhanced silicon incorporation process.

The silicon incorporation into the interconnect element 102 leads to a formation of chemically unbonded Si into crystallites in a surface region of the interconnect element 102. The process conditions are chosen to achieve a silicon incorporation into the first set of crystallites represented by the grains 116 and 120, and not into the second set of crystallites 118, 122.

Figure 2:
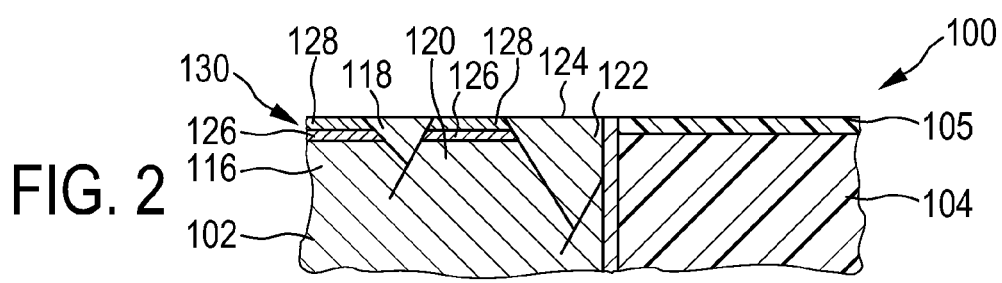
Figure 3:
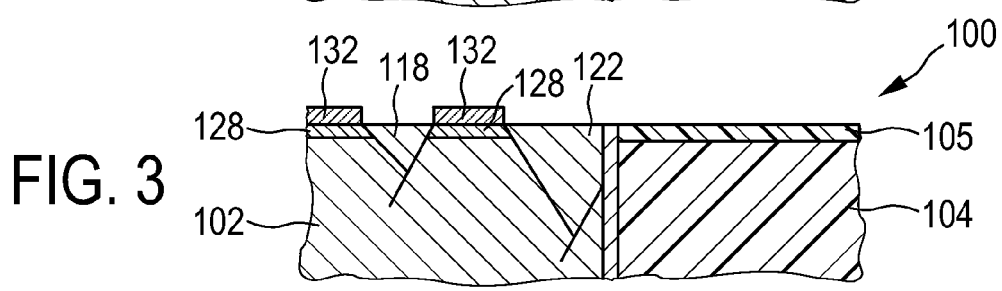

The result of this processing is shown in FIG. 2. In the crystallites 116 and 120, which form the first set of crystallites, a layer stack has been created, which forms the first temporary layer stack 130 according to the claim language. The first temporary layer stack 130 contains a first temporary layer 126, which contains Cu and Si chemically unbonded to each other, and a second temporary layer 128 comprising CuSi on the first temporary layer 126. The first temporary layer structure 130 is only present in the first set of crystallites 116, 120 of this processing stage.

Subsequently, the structure of FIG. 2 is subjected to a reactive annealing step in a nitrogen-providing ambient atmosphere. The reactive annealing step leads to the formation of a silicon nitride layer 132 and completes the formation of the CuSi layer 128. The silicon nitride layer 132 is only present on the first set of crystallites and thus forms a first diffusion-barrier-layer portion on top of the first adhesion-layer portion 128. The second set of crystallites 118, 122 remains uncovered at this processing stage.

The following processing for the completion of the diffusion-barrier cap can be performed according to two alternative methods. One alternative will be described in the following with reference to FIGS. 4 and 5. A second alternative method will be described thereafter with reference to FIGS. 6 and 7.

In the first processing alternative, a temporary layer, which contains Cu and Si chemically unbonded to each other is formed on the crystallites 118 and 122, i.e., the second set of crystallites. This is performed by a treatment with a silicon precursor, which can be one of those mentioned for the formation of the corresponding temporary layer 126 in the first set of crystallites 116, 120. For the purpose of the present description, silane will be used as a Si precursor. The treatment with silane leads to the incorporation of Si into the second set of crystallites 118, 122 to form the temporary layer 134.

The silane treatment is performed with an ambient atmosphere that differs from that used for the Si incorporation into the first set of crystallites by the use of a second temperature that is smaller than the first temperature. Suitable temperature values lower than the first temperature should, however, range above 250° C. Furthermore, a second ambient pressure is used that is higher than the first ambient pressure used during the previous Si incorporation step into the first step of crystallites. Given theses parameters and otherwise identical parameters for the two different Si incorporation steps, the incorporation of silicon can be performed selectively, i.e., only into the second set of crystallites 118, 122. Instead of using an increased second ambient pressure, the same effect can be achieved by increasing the exposure duration to the silicon precursor over the first exposure duration used for the Si incorporation into the first set of crystallites. In this alternative processing, the second ambient pressure is equal to the first ambient pressure. In another alternative processing, both the second ambient pressure and the second exposure duration are increased over the values of the corresponding quantities used during the first Si incorporation into the first set of crystallites. In one alternative embodiment, the second temperature is equal to the first temperature, whereas the second ambient pressure and/or the second exposure duration are increased over the values used during the first incorporation step.

The processing up to this step has the advantage of limiting the incorporation of silicon and leading only to the presence of silicon solved in Cu crystallites. No CuSi layer formation is observed.

Subsequently, nitrogen is provided to the temporary layer 134 in a second reactive annealing step, typically at a temperature of 300° C. or above. This way, the temporary layer 134 is transformed into a silicon nitride layer 136. Thus, a second barrier-cap portion is formed by the silicon nitride layer 136, which completes the formation of a diffusion-barrier cap 138 on the interconnect element 102. The first barrier-cap portion 138.1 consists of a CuSi layer 128 on the interconnect element and of a silicon nitride layer 132 on the CuSi layer. The second barrier-cap 138.2 portion consists of a silicon nitride layer 136 only.

The described processing leads to the formation of a self-aligned diffusion-barrier cap 138 on the interconnect element 102. The reactive annealing steps performed during the formation of the first and second barrier-cap portions 138.1 and 138.2 and to a formation of a Si/O/N layer 105 on top of the dielectric layer 104.

In a second alternative processing, which forms an alternative to that described above with reference to FIGS. 4 and 5 and which will now be described with reference to FIGS. 6 and 7, a second barrier-cap portion is fabricated, which has a layer structure equal to that of the first barrier-cap portion. The processing for the formation of the first barrier-cap portion is that described with reference to FIGS. 1 to 3.

Figure 4:
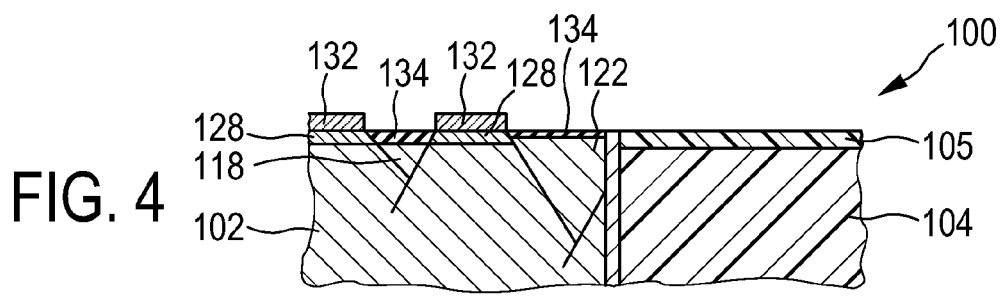

To form the second barrier-cap portion in this embodiment, the treatment of the surface 124 of the interconnect element 102 for an incorporation of Si into the second set of crystallites 118, 122 is modified in comparison with that described with reference to FIGS. 4 and 5. Specifically, the silane treatment includes a partial silicidation as during the first incorporation of silicon described with reference to FIG. 2. This way, a temporary layer structure 140 is fabricated, which has a CuSi layer 142 on the surface 124 of the interconnect element. Underneath the CuSi layer 142, a layer 144 with Si in solution, i.e. Cu and Si chemically unbonded to each other, is formed. A suitable Si precursor can be selected from those mentioned earlier. A silane treatment is again used by way of example for the present embodiment. The silane treatment and the partial silicidation are performed at a second temperature that is higher than the first temperature used during the incorporation of Si into the first set of crystallites and higher than a threshold temperature for the formation of CuSi in the second set of crystallites, given the further parameter of ambient pressure and exposure duration identical to those used for the formation of the first temporary layer structure 130.

Subsequently, a plasma-enhanced treatment in a nitrogen-providing atmosphere is performed. The ambient atmosphere for instance contains $NH_3$. This leads to the formation of a silicon nitride layer 146 on top of the CuSi layer 142. This way, a second barrier-cap portion 138.2 is formed that has an identical layer structure as the first barrier-cap portion 138.1. The diffusion-barrier cap 138 is thus formed by a continuous double-layer structure containing a CuSi adhesion layer and a silicon nitride diffusion-barrier layer. The adhesion layer is formed of a first adhesion-layer portion 128 on the first set of crystallites and a second adhesion-layer portion 142 on the second set of crystallites. The silicon nitride diffusion layer has a first diffusion-barrier-layer portion 132 on the first set of crystallites and a second diffusion-barrier-layer portion 146 on the second set of crystallites.

Figure 5:
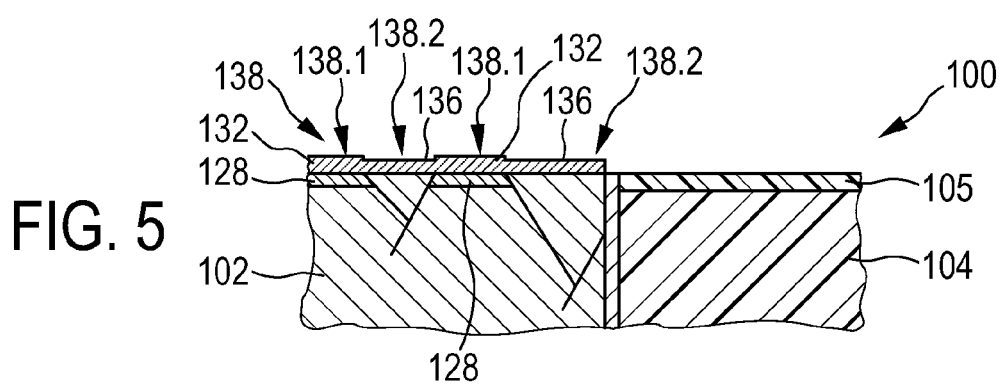
Figure 6:
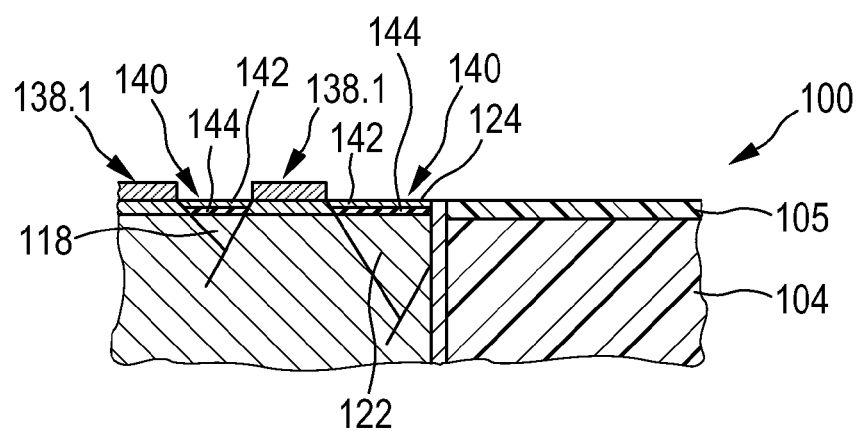
FIGS. 6 and 7 show schematic cross-sectional views of a section of an interconnect element in an interconnect stack of an integrated-circuit device during different stages of the fabrication of a diffusion-barrier cap, according to a second embodiment.
Figure 7:
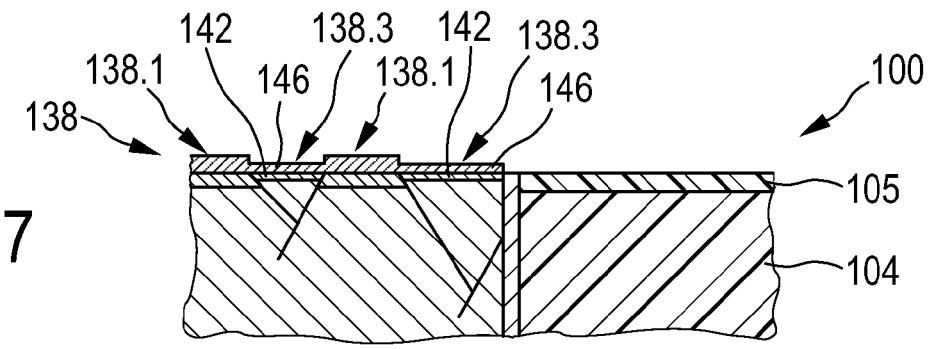

Note that the thickness of the first diffusion-barrier-layer portion 132 is larger than the thickness of the second diffusion-barrier-layer portion 146 and 136 in both alternatives shown in FIGS. 5 and 7. However, the respective thicknesses can be tuned to desired values and can also be made equal, either within the framework of the previously described processing, or by subsequent further processing.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating a diffusion-barrier cap (138) on a Cu-containing interconnect element (102) that has crystallites (116 to 122) of at least two different crystal orientations in an interconnect stack (100) of a semiconductor device, comprising:
    selectively incorporating Si into only a first set of crystallites (116, 120) with at least one first crystal orientation, employing first process conditions, and subsequently selectively forming a first adhesion-layer portion (128) comprising CuSi and a first diffusion-barrier-layer portion (132) only on the first set of crystallites, thus forming a first barrier-cap portion (138.1) and leaving a second set of crystallites (118, 122) of the interconnect element (102) with at least one second crystal orientation exposed, and subsequently
    selectively incorporating Si into only the second set of crystallites (118, 122), employing second process conditions that differ from the first process conditions, and forming a second barrier-cap portion (138.2) comprising a Si-containing second diffusion-barrier layer portion (136) on the second set of crystallites (118, 122) of the interconnect element.

2. The method of claim 1, wherein the step of forming the first barrier-cap portion (138.1) comprises forming, on the first set of crystallites (116, 120) of the interconnect element, a first temporary layer stack (130) comprising a first temporary layer (126), which contains Cu and Si chemically unbonded to each other, and a second temporary layer (128) comprising copper suicide on the first temporary layer, and
    providing nitrogen to the first temporary layer stack (130) in a first reactive annealing step, thus transforming the first temporary layer stack into the first barrier-cap portion (138-1) that contains, on the first set of crystallites (116, 120), a copper suicide layer (128), and a silicon nitride layer (132) on the copper suicide layer.

3. The method of claim 1, wherein forming the first barrier-cap portion (138-1) comprises exposing a surface of the Cu-containing interconnect element containing the first and second sets of crystallites to a first ambient atmosphere that contains a silicon precursor and that has a first ambient pressure, a first ambient temperature, which is lower than a first threshold temperature required for incorporation of Si into the second set of crystallites (118, 122) at the first ambient pressure.

4. The method of claim 3, wherein the first ambient temperature is between 200 degrees Celsius and 425 degrees Celsius.

5. The method of claim 1, wherein forming the second barrier-cap portion (138.2) comprises:
    forming, on the exposed second set of crystallites (118, 122) of the interconnect element, a second temporary layer stack (140) with a layer sequence (142, 144) equal to that of the first temporary layer stack (130), and
    providing nitrogen to the second temporary layer stack (140) in a second reactive annealing step, thus transforming the second temporary layer stack into the second barrier-cap portion (138.2) that contains a copper suicide layer (142) on the second set of crystallites (118, 122) of the interconnect element and a Si-containing diffusion-barrier layer (146) on the copper suicide layer.

6. The method of claim 5, wherein the step of forming the second temporary layer stack (140) comprises exposing the surface containing the first barrier-cap portion (138.1) and the exposed second set of crystallites (118, 122) of the Cu-containing interconnect element to a second ambient atmosphere that has a second ambient pressure and that contains a silicon precursor, at a second ambient temperature higher than a second threshold temperature for formation of CuSi in the second set of crystallites at the second ambient pressure, which second ambient temperature is also higher than the first ambient temperature.

7. The method of claim 1, wherein forming the second barrier-cap portion (138.2) comprises:
    forming, on the exposed second set of crystallites (118, 122) of the interconnect element, only a third temporary layer (134), which contains Cu and Si chemically unbonded to each other;

providing nitrogen to the third temporary layer (134) in a second reactive annealing step, thus transforming the third temporary layer into a second barrier-cap portion (138.2) that contains only a silicon nitride layer (136).

8. The method of claim 7, wherein forming the third temporary layer (134) comprises exposing the second set of crystallites (118, 122) to a second ambient atmosphere that contains the silicon precursor under the following process conditions:

- a second temperature smaller than or equal to the first temperature, and
- a second ambient pressure that is higher than the first ambient pressure or
- a second exposure duration that is longer than the first exposure duration.

* * * * *